US006048651A

United States Patent [19]
Brunner et al.

[11] Patent Number: 6,048,651
[45] Date of Patent: Apr. 11, 2000

[54] FRESNEL ZONE MASK FOR PUPILGRAM

[75] Inventors: Timothy A. Brunner, Ridgefield, Conn.; Joseph P. Kirk, Chelsea; Christopher J. Progler, Hopewell Junction, both of N.Y.

[73] Assignee: International Business Machines Corporation, Armonk, N.Y.

[21] Appl. No.: 09/177,951

[22] Filed: Oct. 23, 1998

[51] Int. Cl.[7] .................................................. G03F 9/00
[52] U.S. Cl. .............................................................. 430/5
[58] Field of Search ......................... 430/5, 22; 356/400, 356/401

[56] References Cited

U.S. PATENT DOCUMENTS

| | | | |
|---|---|---|---|
| 4,575,399 | 3/1986 | Tanaka et al. | 430/5 |
| 4,704,033 | 11/1987 | Fay et al. | 356/401 |
| 5,667,918 | 9/1997 | Brainerd et al. | 430/5 |

OTHER PUBLICATIONS

Y. Borodovsky, Intel Corporation, Portland Technology Development, "Impact of Local Partial Coherence Variations on Exposure Tool Performance," SPIE Proceedings, vol. 2440 (11 pp.).

J. Kirk, C. Progler, IBM Advanced Semiconductor Technology Center, Pinholes and Pupil Fills, *Microlithography World*, pp. 25–28 (Autumn 1997).

J. M. Lavine, M.T. Mason, and D. R. Beaulieu, GCA Corporation, IC Systems Group, "The Effect of Semiconductor Processing Upon the Focusing Properties of Fresnel Zone Plates Used as Alignment Targets," SPIE vol. 470 *Optical Microlithography III: Technology for the Next Decade (1984)*, pp. 122–129.

*Primary Examiner*—S. Rosasco
*Attorney, Agent, or Firm*—Ratner & Prestia; H. Daniel Schnurmann

[57] ABSTRACT

A test photomask comprising a fresnel zone target (FZT) pattern may be used to verify the adjustment of a precision projector illumination system of an image projection system. The method comprises the steps of creating the FZT pattern on a photomask, projecting a pupil diagram onto an image plane using the FZT pattern, and evaluating the pupil diagram to determine the illumination system adjustment.

25 Claims, 4 Drawing Sheets

FRESNEL ZONE MASK FOR PUPILGRAM

TECHNICAL FIELD

The present invention relates generally to the testing of precision projector illumination systems and, more specifically, to the testing of the illumination systems of precision image projectors used in integrated circuit lithography.

BACKGROUND OF THE INVENTION

In the manufacture of semiconductors, integrated circuit patterns are transferred to semiconductor wafers from photomasks by lithography processes using precision image projection tools. Over the last several years, patterns have become smaller and smaller, allowing more devices to be packed onto a chip. The ability to print intricate patterns with excellent image fidelity requires very sophisticated and expensive image projection systems. Various types of illumination systems, such as annular illumination systems, may be used to improve imagery.

Referring now to FIG. 1, there is shown a typical image projection system used in integrated circuit lithography. A light source (not shown) shines a cone of light 10 through photomask 12 having a patterned front surface 14. The light is focused by projection lens 16 onto image plane 18. Typically, a photoresist-coated wafer (not shown) on image plane 18 receives the light, exposing the photoresist and, thus, transferring the image from photomask 12 to the wafer.

It is vital that the illumination systems of such image projection systems are properly optimized, aligned, and uniform across the entire circuit pattern being projected. Otherwise, a variety of imaging imperfections can arise from problems in the illuminator, such as image asymmetry and pattern shifting due to defocus.

Thus, it is beneficial to be able to measure the illumination in a convenient and practical manner to assure proper exposure. It has been proposed in the past to study variations in linewidth (of the projected integrated circuit lines) by mapping an estimated local value of partial coherence for random points across a stepper exposure field and comparing such estimates to the designed value. This is a time-consuming method, and only gives an indication of the size, rather than a detailed picture of the illumination shape.

Another common test is a "telecentricity" test, in which out-of-focus test patterns are exposed, and shifts of these out-of-focus images reveals mis-centering of the illumination. This test only measures the center position of the illumination, however, and does not reveal any information about the size or shape of the illumination.

It has also been proposed to generate a pupil diagram, or "pupil-o-gram", to characterize the illumination, as discussed by Joseph Kirk and Christopher Progler, two of the inventors of the present invention, in *Pinholes and Pupil Fills*, published in Microlithography World, Autumn 1997, pp. 25–28, and incorporated herein by reference. The pupil-o-gram uses what is essentially a pinhole camera technique, wherein a small transparent spot in an opaque photomask (pinhole) or a small opaque spot in a transparent photomask (reverse pinhole) is projected onto the image plane. The light traveling through the pinhole (or around the reverse pinhole) forms a pupil-o-gram image some distance below the wafer plane (typically 10–30 mm), where it can be captured on photochromic film. The pupil-o-gram corresponds to pupil illumination 17 at pupil 19 (having aperture 21) of projection lens 16, hence the term "pupil" diagram or "pupil"-o-gram.

The pupil-o-gram can then be quantitatively evaluated to determine if the distribution of illumination corresponds to the expected results, given the projector settings. The utility of the pinhole camera technique is limited, however, by a tradeoff between contrast and resolution, resulting in the created pupil-o-gram being either high-contrast, low-resolution or low-contrast, high-resolution.

Thus, there is still a need in the art to produce a bright (high-contrast), sharp (high-resolution) image in a convenient and practical manner, to be used in evaluating the illumination source of an image projector.

SUMMARY OF THE INVENTION

The present invention provides a test photomask adapted for verifying the adjustment of an illumination system of a precision projector, the photomask comprising a fresnel zone target (FZT) pattern thereon.

The FZT photomask may be used with a method for verifying the adjustment of the illumination system of a precision projector. The method comprises creating the FZT pattern on a photomask, projecting a pupil diagram onto an image plane using the FZT pattern, and evaluating the pupil diagram to determine the illumination system adjustment. An image of the pupil diagram may be captured on a resist-coated wafer, a photosensitive film, or an electronic image detector.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 2:
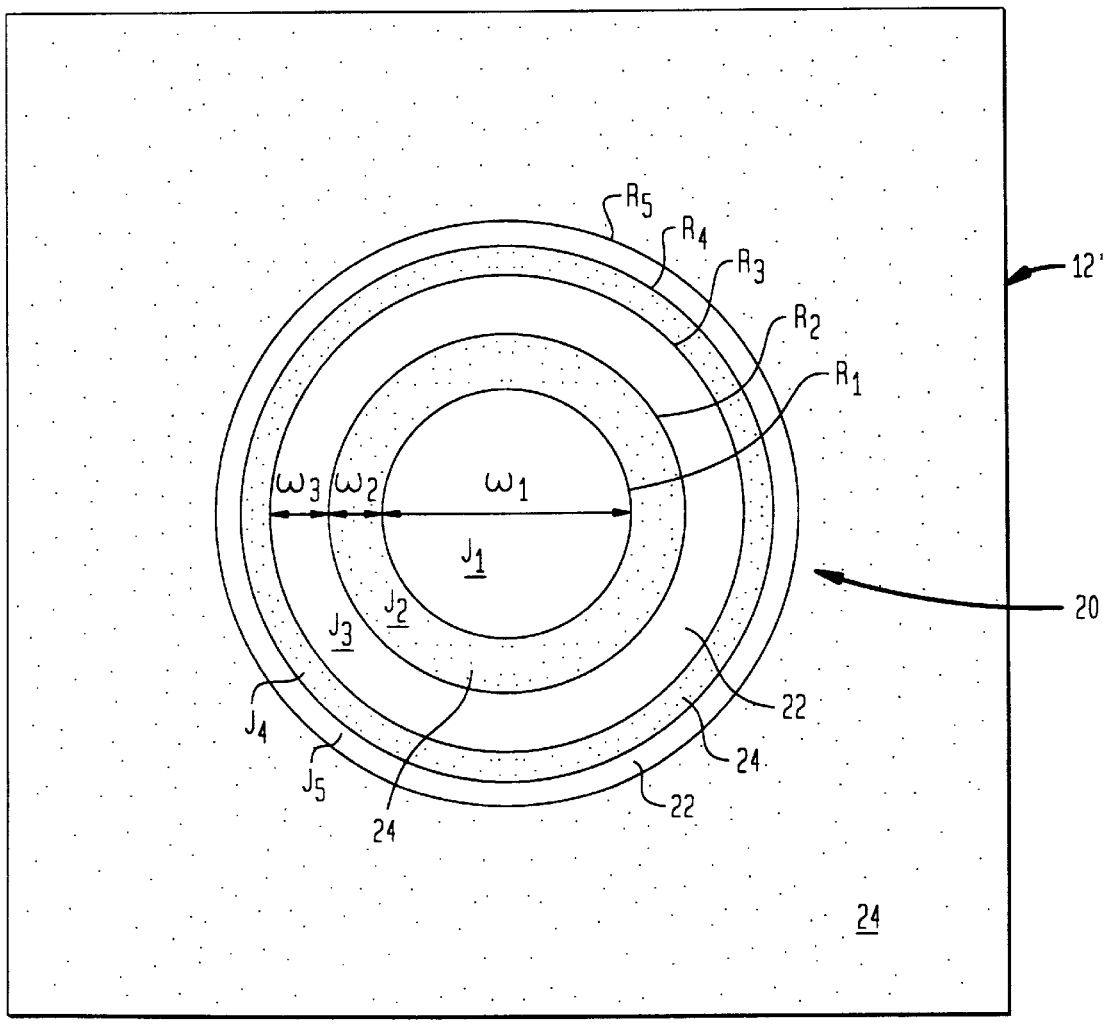
FIG. 2 is a plan view of a circular fresnel zone target pattern on a photomask according to an exemplary embodiment of the present invention.
Figure 3A:
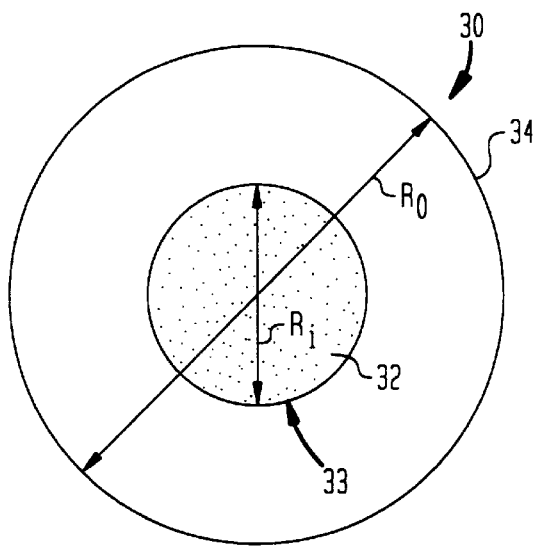
FIGS. 3A and 3B are illustrations of exemplary pupil diagrams, such as can be made with an FZT pattern of the present invention.
Figure 3B:
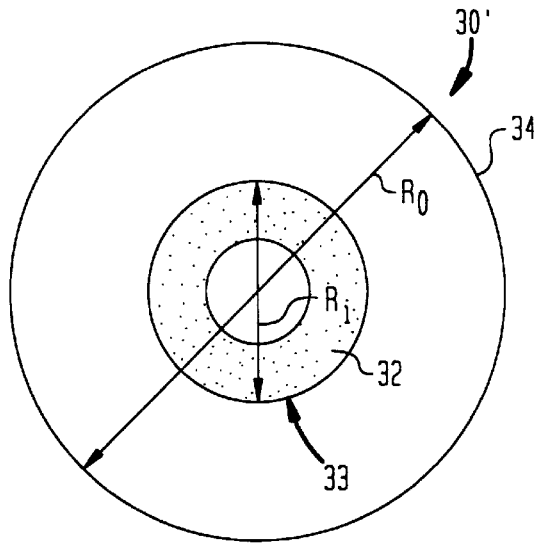

Referring now to the drawing, wherein like reference numerals refer to like elements throughout, FIG. 2 shows an illustration of a plan view of a fresnel zone target (FZT) pattern 20 on a test photomask 12' in accordance with an exemplary embodiment of the present invention. FIGS. 3A and 3B show exemplary pupil diagrams 30 and 30', respectively, such as may be created by the illumination of FZT pattern 20.

Figure 1:
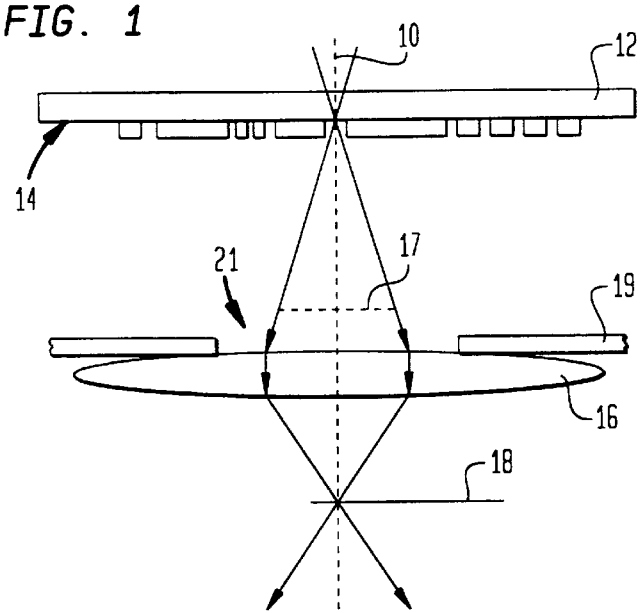
FIG. 1 is an illustration showing the components of a typical integrated circuit projection system.

Using an FZT instead of a pinhole on a photomask, enables the creation of a bright, high-resolution pupil diagram to be used for characterization of the illumination system. As shown in FIG. 3A, shaded portion 32 bounded by inner circle 33 having diameter $R_i$ corresponds to the pupil illumination 17 (shown in FIG. 1) created by the light source (not shown). The larger diameter circle 34 of scattered light having diameter $R_o$ corresponds to the numerical aperture (NA) of pupil 21. The quantity $R_i/R_o$ is referred to as the partial coherence σ. The pupil diagram 30 in FIG. 3A is typical of a pupil diagram obtained using a standard, conical light source. The pupil diagram 30' in FIG. 3B is typical of a pupil diagram obtained using an annular light source.

In its most common form, an FZT comprises concentric substantially circular patterns of alternating phases. As shown in FIG. 2, the patterns may consist of transmissive regions 22 alternating with opaque regions 24 to form an FZT pattern 20. Alternatively, the patterns may consist of two alternating phases of phase-shifted regions, for example 0° and 180° regions, or four alternating phases of phase-shifted regions, for example 0°, 90°, 180°, and 270°. Generally, the more pattern levels required to create the FZT, the more difficult and expensive it is to construct. Thus, the FZT design may be chosen to provide a sufficiently effective pattern that is cost effective. The phase shifting regions may be created by etching the glass to appropriate depths by any method known in the art, wherein a 180° phase-shifting region is twice the depth of a 90° phase-shifting region, and so-on, as is well-known in the art.

For an FZT with 0° and 180° rings, the radius of the $m^{th}$ ring ($R_m$) is given by the fundamental equation $R_m = (m\lambda F)^{1/2}$, where λ is the wavelength of the illumination source radiation and F is the desired focal length of the FZT. The number of rings in a useful pattern may range from 5 to 50, for example. The outer rings, in general, may be narrower than the inner rings. Typically, the mask patterning resolution limits the size of the FZT.

Figure 4:
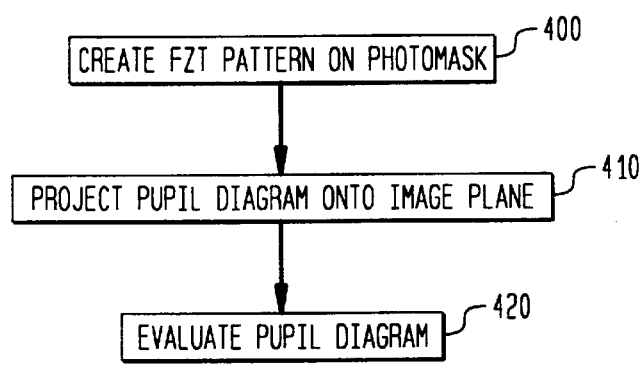
FIG. 4 is a flowchart depicting exemplary process steps of the present invention.
Figure 5:
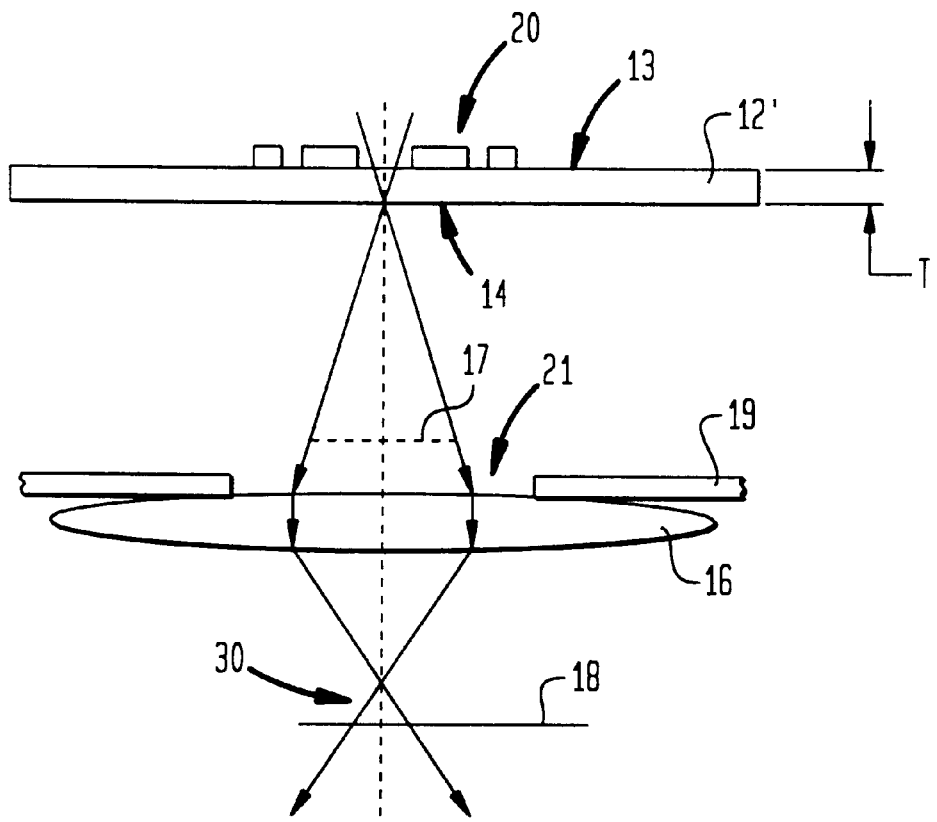
FIG. 5 is an illustration showing an integrated circuit projection system used with a photomask having an FZT pattern on its back surface.

Referring now to FIGS. 4 and 5, there is shown a flowchart depicting an exemplary method according to the present invention and an illustration of an integrated circuit image projection system using this method, respectively. The method comprises, at step 400, creating an FZT pattern 20' on a photomask 12' (shown in FIG. 5); at step 410, projecting a pupil diagram 30 of the FZT pattern onto an image plane 18; and at step 420, evaluating the pupil diagram to determine the illumination system adjustment.

The pupil diagram may be captured on a photoresist-coated wafer, on photosensitive film or other photochromic material, or with a Charged Couple Device (CCD) camera or other electronic image detector. Evaluating the pupil diagram may comprise comparison with a standard expected pupil diagram. Alternatively, evaluation may comprise taking microdensomitor traces of the film, particularly if the pupil diagram has been captured on film. The evaluation step may be used to verify the partial coherence and/or alignment of the illumination system.

To measure the structure of the illumination system, one needs to detect the image at a substantially defocused position. Because many sophisticated exposure systems have focus values adjustable over only a few tens of microns, such defocusing may be insufficient to obtain good pupil diagrams. One solution, as shown in FIG. 5, is to create an appropriate FZT pattern 20' on the normally-unpatterned back surface 13 of a photomask 12'. Therefore, the FZT structure may be designed so that its focal length in the glass of the photomask 12' substrate is equal to the thickness T of the transparent mask, so that the FZT structure thus created forms a pupil diagram on the front surface 14 of the photomask.

An exemplary FZT pattern having a focal length equal to the thickness of the photomask 12', as shown in FIG. 5, can be visualized as comprising N periods having n number of phases in each period, resulting in N*n rings. Thus, as shown in FIG. 2, FZT pattern 20 has 3 periods each having 2 phases (transparent and opaque), resulting in 6 rings ($J_1$–$J_6$). In this case ring $J_6$ is the same phase (opaque) as the rest of the photomask, so it is not defined. It is not necessary to define an even number of rings, so the $(N*n)^{th}$ ring may be omitted merely as a design choice (leaving an FZT pattern with N*n−1 rings.

The FZT pattern may be specifically designed for the illumination system light radiation wavelength λ, and for the theoretical focal length F of the fresnel lens corresponding to the thickness of the photomask and the index of refraction I of the material in which the light wave is propagating (such as the photomask if the FZT is on the back surface of the photomask), so that each ring j=1 . . . N*n has a width $W_j = s_j - s_{j-1}$ where:

$$s_m = (F*(\lambda/I)*(2*m/n))^{1/2} \text{ for } m=0 \ldots N*n.$$

For example, if the FZT pattern 20 is at the back surface 13 of the photomask 12' (assumed to be glass in this case), the focal length will be extended by ΔF=F(I−1), where I is 1.51 (the index of refraction for glass).

The pupil diagram thus created on front surface 14 of photomask 12' may be captured by putting a photosensitive material at the plane of front surface 14. This would be a special operation that is not consistent with the automated nature of such tools, however, and thus impractical in most integrated circuit production lines. Instead, the projection optics of the exposure tool will naturally image this pupil diagram onto the normal wafer plane 18, where it may be captured by any of the methods previously described. Such a pupil diagram will have reasonable brightness and good resolution.

Figure 6:
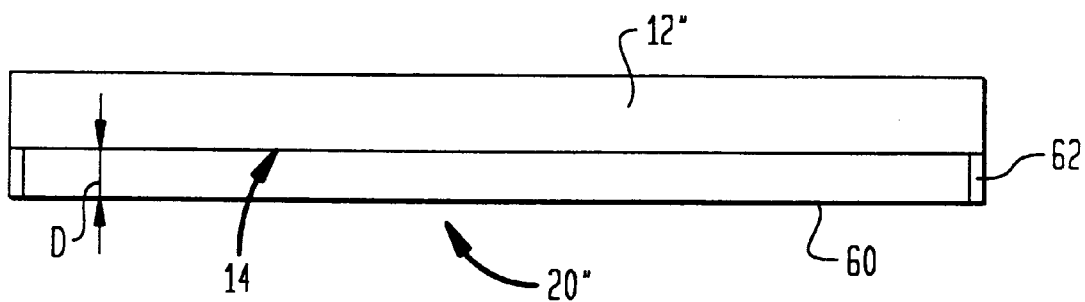
FIG. 6 is a cross-sectional illustration of a photomask having a pellicle with an FZT target thereon.

Although the preferred embodiment is to place the FZT on the back surface of a photomask as shown in FIG. 5, the FZT pattern may also be fabricated in the pellicle membrane. Referring now to FIG. 6, there is shown a cross-sectional illustration of a photomask 12" having a pellicle 60, typically used to prevent dust from falling on the normally-patterned front surface 14 of the photomask 12". Pellicle 60 is supported on a frame 62, and has a FZT pattern 20" thereon. The pellicle stand-off distance D (typically 3 mm) is sufficiently far out of focus to be useful to create a pupil diagram at the normal image plane (image plane 18 as shown in FIG. 5, assuming photomask 12' is replaced by photomask 12").

Figure 7:
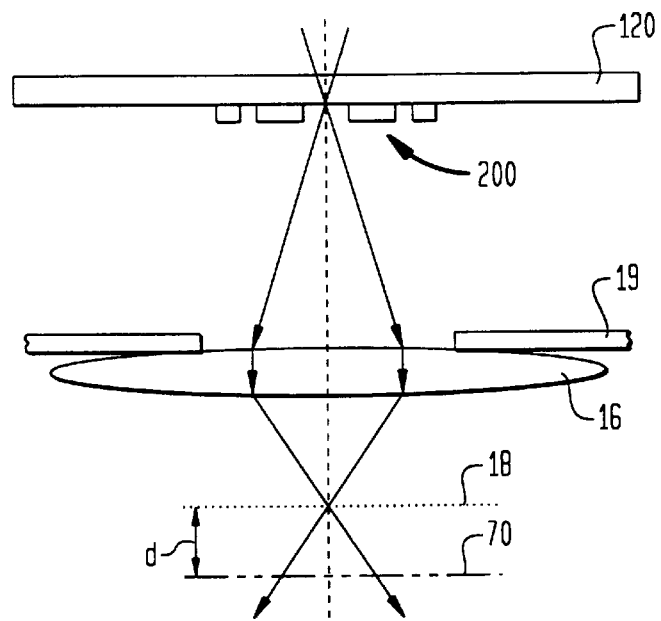
FIG. 7 is an illustration showing an integrated circuit projection system used with a photomask having an FZT pattern on its front surface.

FZT patterns may also be designed to be placed on the front surface of a photomask. Referring now to FIG. 7, there is shown an illustration of an integrated circuit image projection system used with a photomask 120 having an FZT pattern 200 on the front surface 14 of the photomask. To provide the necessary defocus, the pupil diagram is preferably captured on an image plane 70 that is offset by a distance d from the standard wafer plane. Distance d may be in the order of about 25 microns, which is a value achievable by many exposure tools. The pupil diagram derived at such an image plane location, however, tends to be smaller than pupil diagrams created with a photomask having an FZT pattern on its back surface.

The test method of the present invention may be used with illumination systems featuring any radiation wavelength suitable for IC lithography. For example, this invention may be used with conventional lithography techniques (where λ=436 nm, 365 nm or 248 nm), as well as more advanced wavelengths (where λ=193 nm or 157 nm), and even extreme ultra-violet (EUV) lithography where λ is about 10 to 15 nm.

Figure 8:
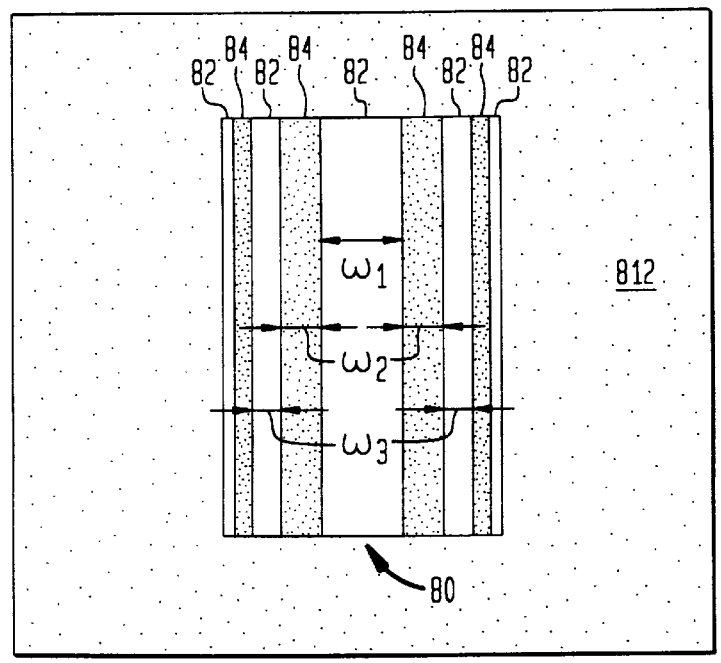
FIG. 8 is a plan view of a linear fresnel zone target pattern on a photomask according to an exemplary embodiment of the present invention.

Although this description has primarily discussed circular FZT patterns, substantially linear FZT designs may also be used with this invention. Linear FZT patterns are analogous to cylindrical lenses rather than normal spherical lenses. Linear FZT patterns only focus one dimension of the pupilgram at a time, but may be used for elementary characterization purposes. Referring now to FIG. 8, there is shown photomask 812 having an exemplary linear FZT pattern 80 thereon. Linear FZT pattern 80 comprises a plurality of alternating transmissive 82 and opaque 84 regions, each region having a width $W_z$ determined in the same fashion as the widths of the rings in a circular FZT pattern, as described above.

The test photomask of the present invention may be fabricated with multiple FZT targets, so that a single exposure may create pupil diagrams in many locations across the image field to enable evaluation the local illumination characteristics. Thus, in the course of routine lithography operations, a quality control step may be performed whereby the test photomask is inserted and pupil diagrams are created to check the illumination system to look for any deviation from its normal adjustment or to verify each new system adjustment.

EXAMPLE

The following example is included to more clearly demonstrate the overall nature of the invention. This example is exemplary, but not restrictive, of the invention.

An FZT pattern was created on the back of a standard photomask having a thickness (corresponding to focal length F) of 250 mils (6.35e3 microns) and constructed of glass (index of refraction I=1.51) for use with an exposure tool using radiation having a wavelength λ=248 nm. An FZT pattern having 7 periods (N=7) and two phases (n=2) was created with N*n=14 rings or zones constructed with dimensions calculated by the following equations and having widths (in microns) according to Table 1.

$$W_j = S_j - S_{j-1}; \ j = 1 \ldots N*n$$

$$S_m = (F*(\lambda/I)*(2*m/n))^{1/2}; \ m = 0 \ldots N*n$$

TABLE 1

| Ring | Width (microns) | Ring | Width (microns) |
|---|---|---|---|
| $W_1$ | 32.294 | $W_8$ | 5.899 |
| $W_2$ | 13.377 | $W_9$ | 5.541 |
| $W_3$ | 10.264 | $W_{10}$ | 5.241 |
| $W_4$ | 8.653 | $W_{11}$ | 4.985 |
| $W_5$ | 7.624 | $W_{12}$ | 4.763 |
| $W_6$ | 6.892 | $W_{13}$ | 4.568 |
| $W_7$ | 6.338 | $W_{14}$ | 4.395 |

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A photomask for verifying an adjustment of a precision projector illumination system, the photomask comprising a fresnel zone target pattern disposed over a surface of the photomask and adapted to project a pupil diagram onto an image plane.

2. The photomask according to claim 1, wherein the fresnel zone target pattern is disposed over a back surface of the photomask.

3. The photomask according to claim 1, wherein the fresnel zone target pattern is disposed over a front surface of the photomask.

4. The photomask according to claim 1, wherein the fresnel zone target pattern is formed over a pellicle membrane offset from the front surface of the photomask.

5. The photomask according to claim 1, wherein the fresnel zone target pattern is substantially linear.

6. The photomask according to claim 1, wherein the fresnel zone target pattern is substantially circular.

7. The photomask according to claim 6, having an index of refraction and a thickness, and adapted to be used with light having a wavelength, wherein the fresnel zone target pattern has a focal length and comprises a plurality of rings corresponding to one or more periods having one or more phases in each period, each ring having a width according to the equation $$W_j = s_j - s_{j-1} \text{ for } j = 1 \ldots N*n$$

where:

$s_m = ((F*\lambda*2*m)/(I*n))^{1/2}$ for $m = 0 \ldots N*n$,

N is the number of periods, n is the number of phases in each period,

N*n is the number of rings,

F is the focal length of the freznel zone target pattern and is equal to the photomask thickness, λ is the light wavelength, and I is the index of refraction of the photomask.

8. The photomask according to claim 7, wherein the wavelength is less than about 436 nm.

9. The photomask according to claim 7, wherein the wavelength is selected from the group consisting of about 436 nm, 365 nm, 248 nm, 193 nm, 157 nm, and in the range of about 10 nm to 15 nm.

10. The photomask according to claim 7, wherein the number of phases n is a positive even integer.

11. The photomask according to claim 10, wherein the number of phases n=2, and the phases consist of a plurality of light transmissive regions alternating with a respective plurality of opaque regions.

12. The photomask according to claim 10, wherein the number of phases n=2, and the phases are 0° and 180°.

13. The photomask according to claim 10, wherein the number of phases n=4, and the phases are 0°, 90°, 180°, and 270°.

14. The photomask according to claim 6, having an index of refraction and a thickness, and adapted to be used with light having a wavelength, wherein the fresnel zone target pattern has a focal length and comprises a plurality of rings corresponding to one or more periods having one or more phases in each period, each ring having a width according to the equation $$W_j = s_j - s_{j-1} \text{ for } j=1 \ldots N*n-1$$

where:

$s_m = ((F*\lambda*2*m)/(I*n))^{1/2}$ for m=0 . . . N*n−1,

N is the number of periods, n is the number of phases in each period,

N*n−1 is the number of rings,

F is the focal length of the freznel zone target pattern and is equal to the photomask thickness, $\lambda$ is the light wavelength, and I is the index of refraction of the photomask.

15. The photomask according to claim 14, wherein the wavelength is less than about 436 nm.

16. The photomask according to claim 14, wherein the wavelength is selected from the group consisting of about 436 nm, 365 nm, 248 nm, 193 nm, 157 nm, and in the range of about 10 nm to 15 nm.

17. The test photomask according to claim 14, wherein the number of phases n is a positive even integer.

18. The photomask according to claim 14, wherein the number of phases n=2, and the phases consist of a plurality of light transmissive regions alternating with a respective plurality of opaque regions.

19. The photomask according to claim 17, wherein the number of phases n=2, and the phases are 0° and 180°.

20. The photomask according to claim 17, wherein the number of phases n=4, and the phases are 0°, 90°, 180°, and 270°.

21. A method for verifying the adjustment of an illumination system, the method comprising the steps of:

creating a fresnel zone target pattern on a photomask;

projecting a pupil diagram created by the fresnel zone target pattern onto an image plane; and evaluating the pupil diagram to determine an adjustment of the illumination system.

22. The method according to claim 21, further comprising the step of capturing an image of the pupil diagram on one of i) a resist-coated wafer and ii) a photosensitive film.

23. The method according to claim 21, further comprising the step of evaluating the pupil diagram by comparison to a predetermined pupil diagram.

24. The method according to claim 21, further comprising the steps of:

capturing the pupil diagram on a photosensitive film, and evaluating the captured pupil diagram by creating a microdensitometer trace of the photosensitive film.

25. The method according to claim 21, further comprising the step of capturing an image of the pupil diagram with an electronic image detector.

* * * * *